United States Patent
Ekbote et al.

(10) Patent No.: US 8,119,470 B2
(45) Date of Patent: Feb. 21, 2012

(54) MITIGATION OF GATE TO CONTACT CAPACITANCE IN CMOS FLOW

(75) Inventors: Shashank Sureshchandra Ekbote, Allen, TX (US); Borna Obradovic, McKinney, TX (US); Lindsey Hall, Plano, TX (US); Craig Huffman, Krugerville, TX (US); Ajith Varghese, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 199 days.

(21) Appl. No.: 11/726,253

(22) Filed: Mar. 21, 2007

(65) Prior Publication Data

US 2008/0230815 A1  Sep. 25, 2008

(51) Int. Cl.
*H01L 21/338* (2006.01)
*H01L 21/336* (2006.01)
*H01L 21/4763* (2006.01)

(52) U.S. Cl. ........ 438/185; 438/303; 438/305; 438/306; 438/595; 257/E21.626; 257/E21.64

(58) Field of Classification Search .......... 438/184, 438/230, 303–304, 595–596, 305, 306; 257/E21.626, E21.64
See application file for complete search history.

(56) References Cited

U.S. PATENT DOCUMENTS

| | | | | |
|---|---|---|---|---|
| 5,472,890 A | * | 12/1995 | Oda | 438/305 |
| 6,172,411 B1 | * | 1/2001 | Chao et al. | 257/639 |
| 6,512,266 B1 | * | 1/2003 | Deshpande et al. | 257/333 |
| 6,713,826 B2 | * | 3/2004 | Uehara et al. | 257/410 |
| 7,348,233 B1 | * | 3/2008 | Gerhardt et al. | 438/199 |
| 2005/0064635 A1 | * | 3/2005 | Ajmera et al. | 438/184 |
| 2005/0227446 A1 | * | 10/2005 | Kao et al. | 438/305 |
| 2006/0019456 A1 | * | 1/2006 | Bu et al. | 438/303 |
| 2006/0081941 A1 | * | 4/2006 | Iwata et al. | 257/379 |
| 2006/0121710 A1 | * | 6/2006 | Liang et al. | 438/584 |
| 2006/0246641 A1 | * | 11/2006 | Kammler et al. | 438/184 |
| 2006/0281270 A1 | * | 12/2006 | Meer et al. | 438/303 |
| 2007/0037336 A1 | * | 2/2007 | Kwon et al. | 438/197 |

* cited by examiner

*Primary Examiner* — Kevin Parendo
(74) *Attorney, Agent, or Firm* — Warren L. Franz; Wade J. Brady, III; Frederick J. Telecky, Jr.

(57) ABSTRACT

Sidewall spacers that are primarily oxide, instead of nitride, are formed adjacent to a gate stack of a CMOS transistor. Individual sidewall spacers are situated between a conductive gate electrode of the gate stack and a conductive contact of the transistor. As such, a capacitance can develop between the gate electrode and the contact, depending on the dielectric constant of the interposed sidewall spacer. Accordingly, forming sidewall spacers out of oxide, which has a lower dielectric constant than nitride, mitigates capacitance that can otherwise develop between these features. Such capacitance is undesirable, at least, because it can inhibit transistor switching speeds. Accordingly, fashioning sidewall spacers as described herein can mitigate yield loss by reducing the number of devices that have unsatisfactory switching speeds and/or other undesirable performance characteristics.

10 Claims, 6 Drawing Sheets

MITIGATION OF GATE TO CONTACT CAPACITANCE IN CMOS FLOW

FIELD

The disclosure herein relates generally to semiconductor processing, and more particularly to mitigating gate to contact capacitance in a CMOS process flow.

BACKGROUND

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be an effort toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as die. This may include the width and spacing of interconnecting lines, spacing and diameter of contact holes, as well as the surface geometry of various other features (e.g., corners and edges).

It can be appreciated that significant resources go into scaling down device dimensions and increasing packing densities. For example, significant man-hours may be required to design such scaled down devices, equipment necessary to produce such devices may be expensive, and/or processes related to producing such devices may have to be very tightly controlled and/or be operated under very specific conditions, etc. Accordingly, it can be appreciated that there can be significant costs associated with exercising quality control over semiconductor fabrication, including, among other things, costs associated with discarding defective units, and thus wasting raw materials and/or man-hours, as well as other resources, for example. Additionally, since the units are more tightly packed on the wafer, more units are lost when some or all of a wafer is defective and thus has to be discarded. Accordingly, techniques that mitigate yield loss (e.g., a reduction in the number of acceptable or usable units), among other things, would be desirable.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

Sidewall spacers that are primarily oxide, instead of nitride, are formed adjacent to a gate stack of a CMOS transistor. Individual sidewall spacers are situated between a conductive gate electrode of the gate stack and a conductive contact of the transistor. As such, a capacitance can develop between the gate electrode and the contact, depending on the dielectric constant of the interposed sidewall spacer. Accordingly, forming sidewall spacers out of oxide, which has a lower dielectric constant than nitride, mitigates capacitance that can otherwise develop between these features. Such capacitance is undesirable, at least, because it can inhibit transistor switching speeds. Accordingly, fashioning sidewall spacers as described herein can mitigate yield loss by reducing the number of devices that have unsatisfactory switching speeds and/or other undesirable performance characteristics.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION

Figure 1:
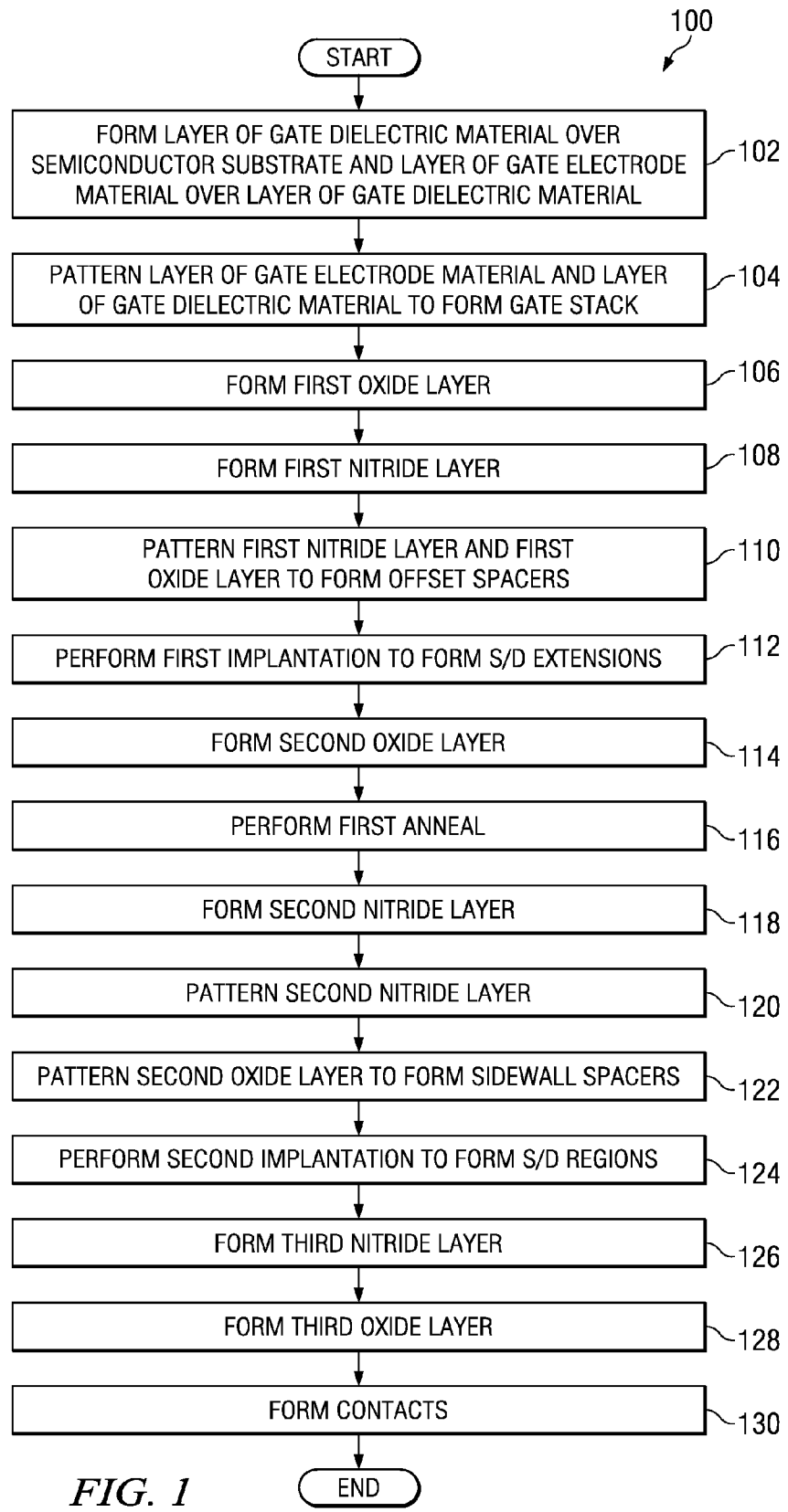
FIG. 1 is a flow diagram illustrating an example methodology for fashioning oxide sidewall spacers that mitigate gate to contact capacitance.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

An example methodology 100 for forming oxide sidewall spacers is illustrated in FIG. 1, and an example semiconductor substrate 200 whereon such a methodology is implemented in forming a CMOS transistor is illustrated in cross-sectional view in FIGS. 2-15. As will be appreciated, forming oxide sidewall spacers as disclosed herein mitigates yield loss by producing devices that have desired switching speeds, where the oxide sidewall spacers inhibit the development of a capacitance which can degrade switching speeds. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
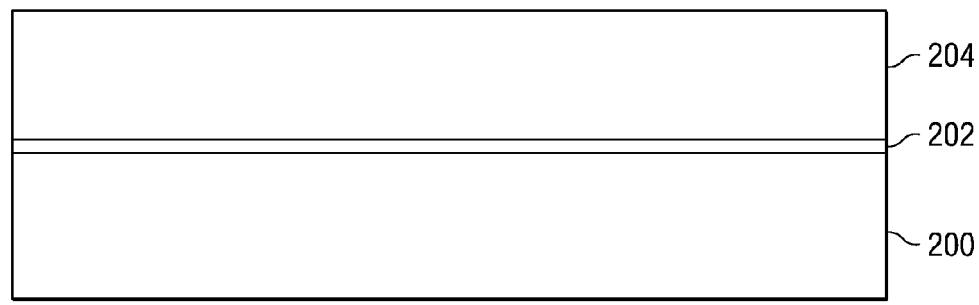
FIGS. 2-15 are cross-sectional views of an example semiconductor substrate whereon oxide sidewall spacers are formed as part of a CMOS process flow to mitigate gate to contact capacitance.

At 102, a layer of gate dielectric material 202 is formed over the semiconductor substrate 200 and a layer of gate electrode material 204 is formed over the layer of gate dielectric material 202 (FIG. 2). The layer of gate dielectric material 202 generally comprises an oxide (or other dielectric) based material and/or a high-k material, for example, and is relatively thin, being formed to a thickness of between about 1 nm and about 20 nm, for example. The layer of gate electrode material 204 generally comprises a polysilicon (or other semiconductor) based material, and is formed to a thickness of between about 20 nm and about 100 nm, for example.

Figure 3:
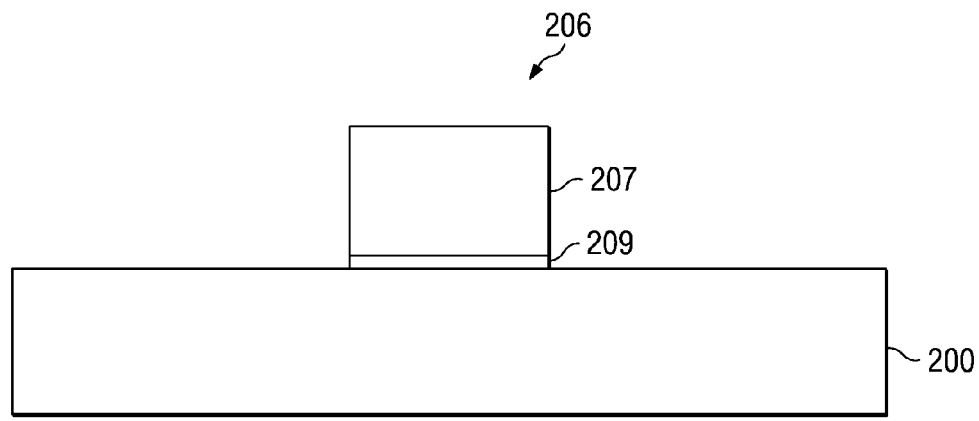

The layer of gate electrode material 204 and the layer of gate dielectric material 202 are then patterned at 104 to establish a gate structure or stack 206 comprising a gate electrode 207 and a gate dielectric 209 (FIG. 3). It will be appreciated that this, as well as other patterning described herein, can be performed with lithographic techniques, where lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

Figure 4:
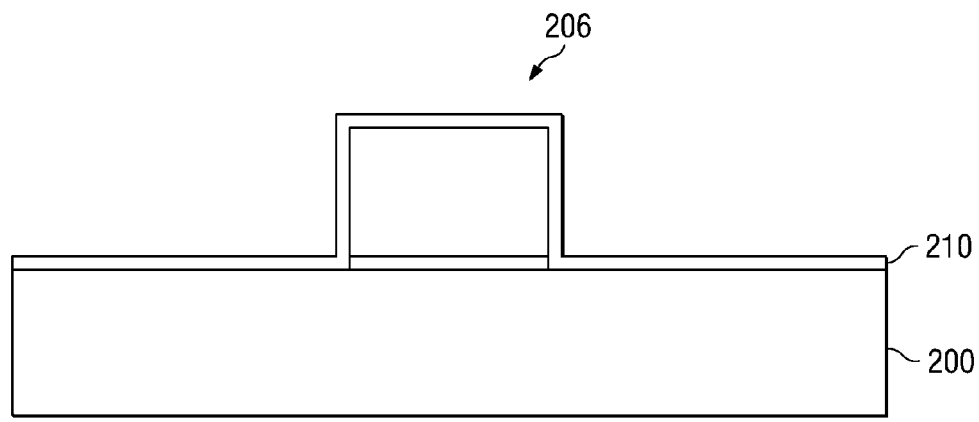
Figure 5:
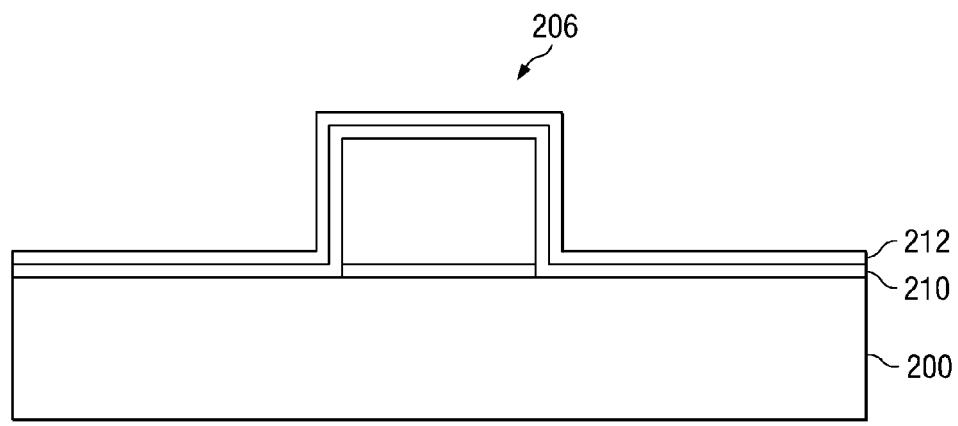

A relatively thin first layer of oxide (or other dielectric) based material 210 is then formed over the gate stack 206 and exposed portions of the substrate 200 at 106 (FIG. 4). By way of example, the first layer of oxide based material 210 may be formed by a well controlled deposition process to a thickness of around 20 Å, for example. Alternatively, a thermal growth process may be employed to form the first layer of oxide based material 210. In this case, since the layer of gate electrode material 204 may comprise polysilicon, and the first layer of oxide based material 210 is grown therefrom (as well as from the substrate 200), the first layer of oxide based material 210 may be referred to as a layer of poly-ox based material, for example. At 108, a relatively thin first layer of nitride based material 212 is formed (e.g., deposited) over the first layer of oxide based material 210 (FIG. 5). The first layer of nitride based material 212 may be formed to a thickness of around 30 Å, for example.

Figure 6:
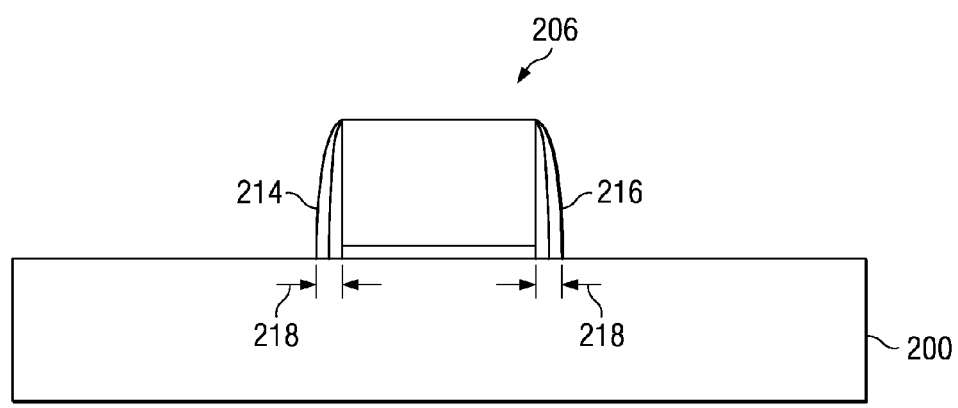
Figure 7:
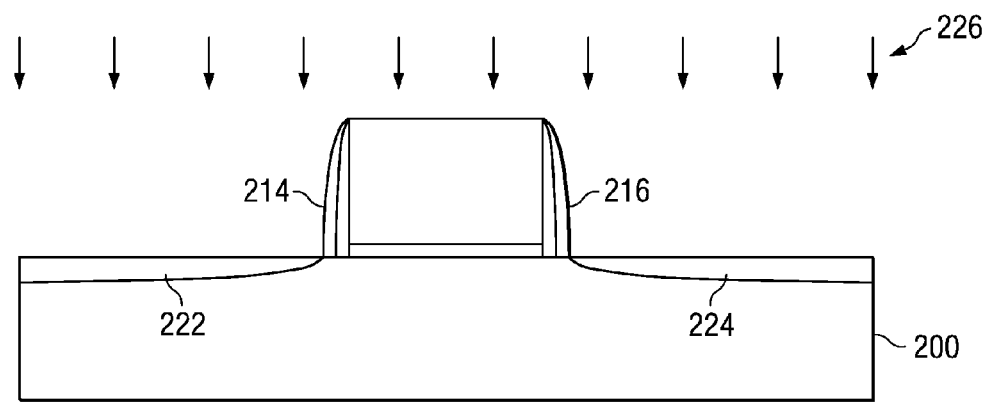

At 110, the first layer of nitride based material 212 and the first layer of oxide based material 210 are patterned (e.g., anisotropically etched) to form offset spacers 214, 216 adjacent to the gate stack 206 (FIG. 6). The offset spacers 214, 216 may have a width 218 of between about 50 Å and about 100 Å, for example. Source and drain extension regions 222, 224 are formed in the substrate 200 at 112 by a first implantation 226 whereby dopants are implanted into the substrate 200, where the dopants are substantially blocked by the gate stack 206 and the offset spacers 214, 216 (FIG. 7). Depending upon the type of transistor being formed (e.g., PMOS or NMOS), p type dopant atoms (e.g., Boron (B)) and/or n type dopant atoms (e.g., Phosphorous (P), Arsenic (As) and/or Antimony (Sb)) can be implanted at 112. It can be appreciated that some of the dopants may also be implanted into the top of the gate electrode 207 during the implantation at 112 (e.g., depending upon the thickness of the first layer of oxide based material 210 overlying the gate electrode 207—which can be selectively etched a desired degree in a prior action, such as during the patterning at 110 to form the offset spacers 214, 216).

Figure 8:
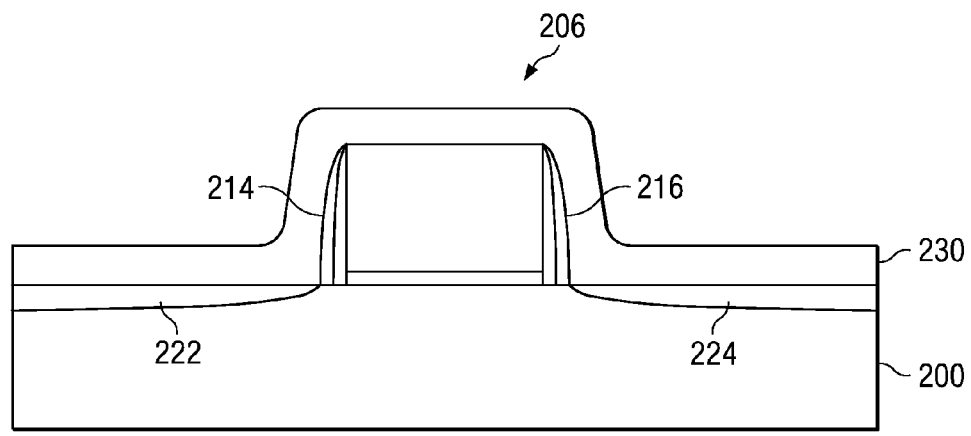
Figure 9:
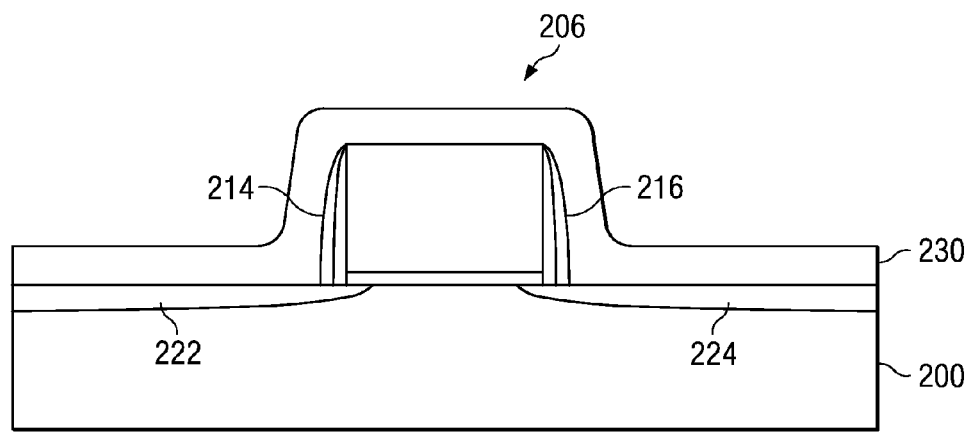

At 114, a second layer of oxide based material 230 is formed (e.g., deposited) over the gate stack 206, offset spacers 214, 216 and exposed portions of the substrate 200 (FIG. 8). This second layer of oxide based material 230 may be formed to a thickness of between about 350 Å and about 500 Å, for example. A first anneal can then be performed at 116 to activate the dopants within the extension regions 222, 224 causing them to diffuse under the gate stack 206 slightly (FIG. 9). It will be appreciated that the second layer of oxide based material 230 mitigates outdiffusion of dopants from the source and drain extension regions 222, 224 up through the surface of the substrate 200 during this anneal. Accordingly, forming the second layer of oxide based material 230 as described herein streamlines the fabrication process by eliminating the need for a specific outdiffusion mitigation layer that would otherwise be necessary if a layer of nitride based material or some other type of material were initially formed over exposed portions of the substrate 200, as is conventionally done.

Figure 10:
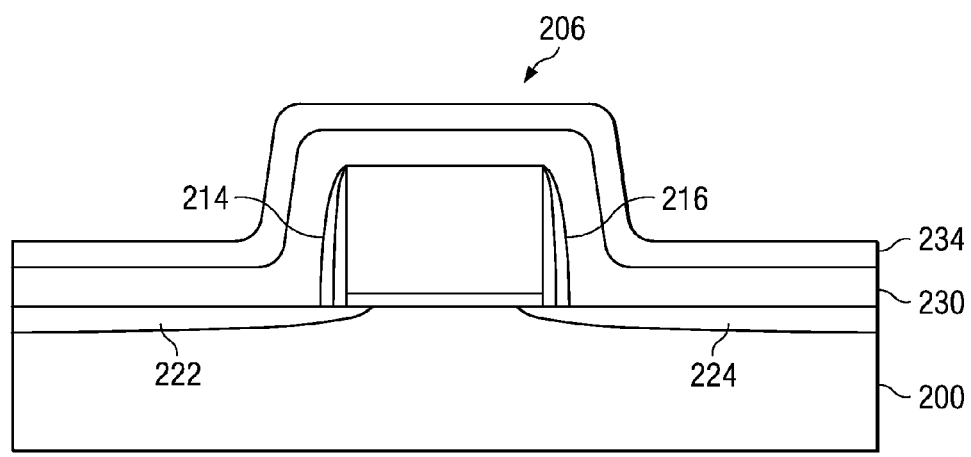
Figure 11:
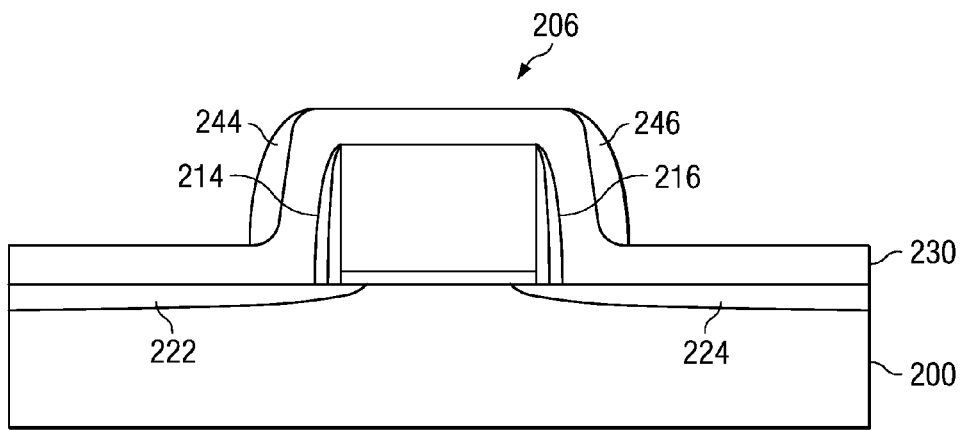

A second layer of nitride based material 234 is formed (e.g., deposited) over the second layer of oxide based material 230 at 118 (FIG. 10). The thickness of the second layer of nitride based material 234 is a function of the thickness of the second layer of oxide based material 230, as well as the selectivity of the etchant utilized to pattern the second layer of nitride based material 234 and the second layer of oxide based material 230. For example, if the etchant removes oxide five times faster than it removes nitride, then the second layer of nitride based material 234 is generally ⅕ the thickness of the second layer of oxide based material 230. Accordingly, if the second layer of oxide based material 234 is around 450 Å thick, for example, then the second layer of nitride based material would be ⅕ of that or around 90 Å thick. In this manner, when concurrently exposed to a particular etchant, the second layer of nitride based material 234 and the first layer of oxide based material 230 are removed at about the same time.

Figure 12:
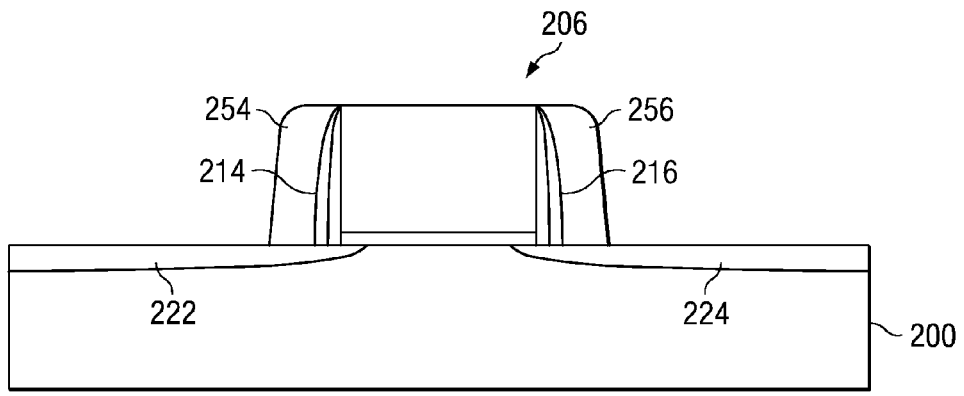

At 120, the second layer of nitride based material 234 is patterned (e.g., anisotropically etched) such that vertically directed or extending portions 244, 246 of the second layer of nitride based material 234 remain over the second layer of oxide based material 230 alongside the gate stack 206 (FIG. 11), and horizontally directed or extending portions of the second layer of nitride based material 234 are removed. The second layer of oxide base material 230 is then patterned (e.g., anisotropically etched) at 122 to form oxide sidewall spacers 254, 256 (FIG. 12). It will be appreciated that the oxide sidewall spacers 254, 256 have a more vertical or rectangular shape than they would otherwise have in the absence of the overlying nitride portions 244, 246. In particular, horizontally directed or extending areas of the second layer of oxide based material 230 are removed, and vertically directed or extending areas of the second layer of oxide based material 230 underlying the nitride portions 244, 246 are left not removed during the patterning at 122 because they are protected by the overlying nitride portions 244, 246. Further, since the thickness of the second layer of nitride based material 234 is chosen/designed as a function of the selectivity of the etchant utilized and the thickness of the second layer of oxide based material 230, the nitride portions 244, 246 are removed at about the time the second layer of oxide based material 230 is removed/etched through. In this manner, substantially oxide only sidewall spacers 254, 256 remain adjacent to the gate stack 206. Moreover, it will be appreciated that the offset sidewall spacers (and the extension implants 222, 224) may optionally be omitted so that there is merely oxide 254, 256 adjacent to the gate stack 206 to further mitigate gate to contact capacitance, as will be appreciated.

Figure 13:
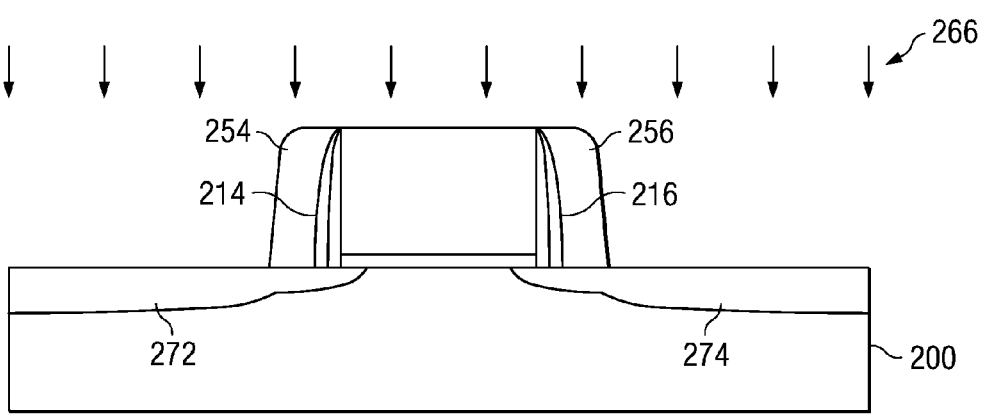
Figure 14:
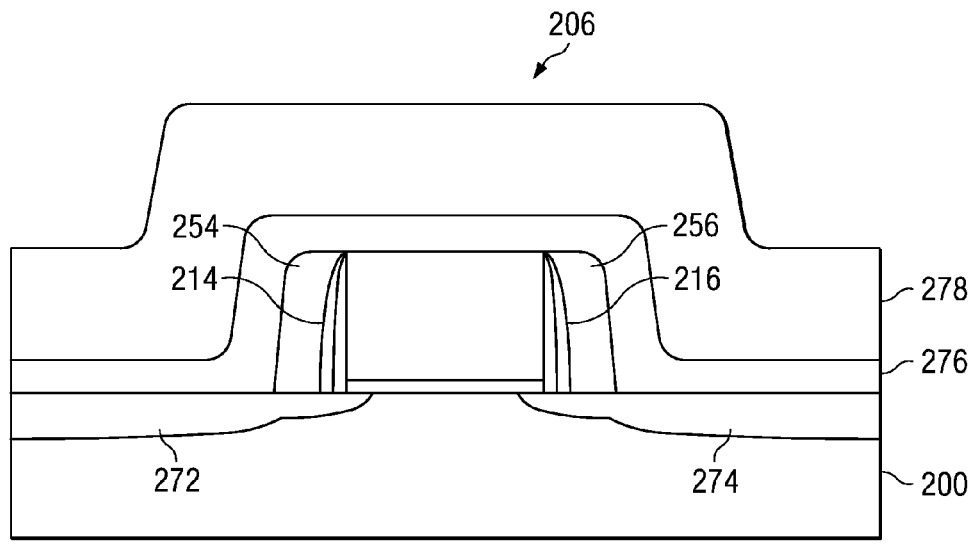

With the sidewall spacers 254, 256 in place, a second implantation 266 is performed at 124 to form source and drain regions 272, 274 in the substrate 200, with the implanted dopants being substantially blocked by the gate stack 206 and the sidewall spacers 254, 256 (FIG. 13). A third layer of nitride based material 276 is formed over gate stack 206, sidewall spacers 254, 256 and exposed portions of the substrate 200 at 126 (FIG. 14). The third layer of nitride based material 276 can be formed to a thickness of between about 200 Å and about 400 Å, for example. A third layer of oxide based material 278 is formed over the third layer of nitride based material 276 at 128 (FIG. 14). The third layer of oxide based material 278 can be formed to a thickness of between about 500 Å and about 1500 Å, for example.

Figure 15:
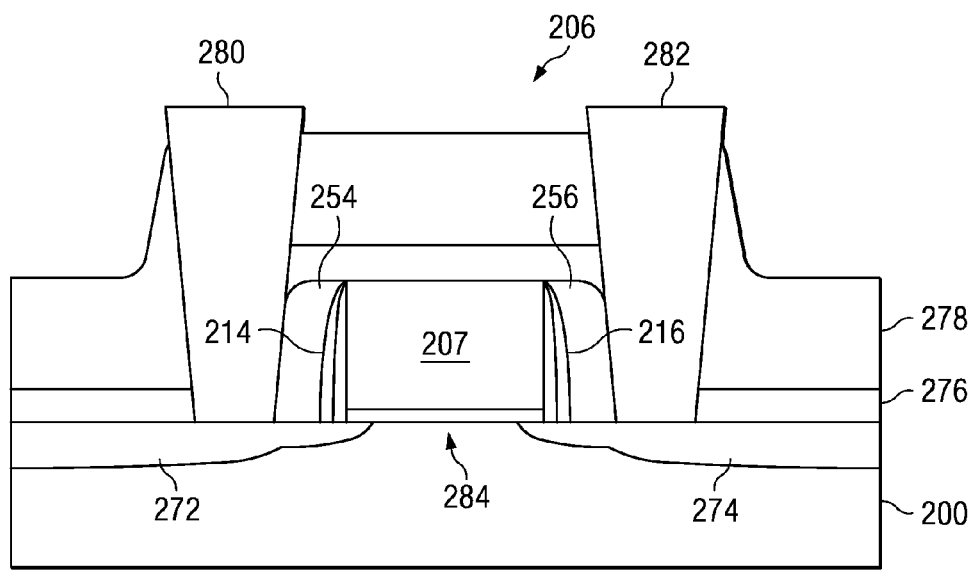

Conductive contacts 280, 282 are then formed down to the source and drain regions 272, 274 at 130 (FIG. 15). Vias are formed (e.g., etched) down through the third layer of oxide based material 278 and the third layer of nitride based material 276 and then filled with a conductive material such as tungsten or copper, for example, to form the contacts 280, 282. In particular, portions of the third layer of nitride based material 276 alongside the gate stack 206 are removed when the vias are formed for the contacts 280, 282. The contacts 280, 282 thus widen out slightly as they go up from the source and drain regions 272, 274. Although this may be slightly exaggerated in FIG. 15, this tapering or flaring out generally results in the contacts 280, 282 remaining in continuous contact with the oxide sidewall spacers 254, 256. In this manner, little to none of the third layer of nitride based material 276, which has a higher dielectric constant (e.g., relative to oxide)—and can thus lead to a greater gate to contact capacitance, comes between the conductive contacts 280, 282 and the gate electrode 207. As such, gate to contact capacitance is mitigated and switching speeds of the device are thereby not inhibited.

Thereafter, further back end processing can be performed where one or more conductive and/or dielectric layers can be formed and treated in some manner, for example. Also, it will be appreciated that an optional second anneal can be performed to activate the dopants of the source and drain regions 272, 274 and drive them slightly under the gate stack 206. Such a second anneal would generally be performed at a higher temperature than the first anneal performed at 116. Accordingly, even though the source and drain extension regions 222, 224 may have already been activated by the first anneal at 116, the source and drain extension regions 222, 224 would be further activated and driven under the gate stack 206 by such a second anneal.

It will be appreciated that a channel region 284 is defined in the substrate 200 under the gate stack 206 and between the source and drain extension regions 222, 224 (FIG. 15). The transistor "operates", at least in part, by conducting a current in the channel region 284 between the source and drain extension regions 222, 224 when certain (respective) voltages are applied to the gate electrode 207, the source region 272 (e.g., via contact 280) and the drain region 274 (e.g., via contact 282). It will also be appreciated that scaling-down device dimensions can lead to a higher effective yield by producing more devices on a die and/or more die per semiconductor wafer. Nevertheless, capacitance that can develop between the conductive gate electrode 207 and the conductive contact 282 (e.g., due to the k value of dielectric materials situated there-between) can slow down the switching speed of the transistor as this accumulated potential has to be discharged before the transistor can switch or toggle again. Such reduced switching speeds can make the transistor unsuitable for its intended purpose, thus lowering the effective yield. Forming the sidewall spacers 254, 256 out of oxide, which has a low dielectric constant, thus mitigates yield loss by inhibiting capacitive coupling.

It will be appreciated that substrate and/or semiconductor substrate as used herein may comprise any type of semiconductor body (e.g., silicon, SiGe, SOI) such as a semiconductor wafer and/or one or more die on a wafer, as well as any other type of semiconductor and/or epitaxial layers associated therewith. Also, while reference is made throughout this document to exemplary structures in discussing aspects of methodologies described herein (e.g., those structures presented in FIGS. 2-15 while discussing the methodology set forth in FIG. 1), it will be appreciated that those methodologies are not to be limited by the corresponding structures presented. Rather, the methodologies (and structures) are to be considered independent of one another and able to stand alone and be practiced without regard to any of the particular aspects depicted in the drawings. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated.

What is claimed is:

1. A method of manufacturing an integrated circuit, comprising:

forming a gate stack over a semiconductor substrate, the gate stack including a gate electrode formed over a gate dielectric;

forming offset spacers on sidewalls of the gate stack;

after forming the offset spacers, forming source/drain extension regions in a first implantation into portions of the substrate that are not covered by the gate stack or the offset spacers;

forming a layer of oxide material over the top of the gate stack, over and in contact with the offset spacers over the sidewalls of the gate stack, and over the not covered portions of the substrate;

after forming the layer of oxide material, conducting a first anneal to activate dopants that were implanted during the first implantation;

forming a first layer of nitride material over the layer of oxide material including over the top of the gate stack, over the offset spacers, and over the not covered portions of the substrate;

etching the first layer of nitride material in a first etch to remove the first layer of nitride material from over the top of the gate stack and anisotropically from over the not covered portions of the substrate, leaving portions of the first layer of nitride material remaining over the offset spacers;

following the first etch, etching the layer of oxide material in a second etch to remove parts of the layer of oxide material from over the top of the gate stack and anisotropically from over the not covered portions of the substrate, leaving portions of the layer of oxide material remaining over the offset spacers, wherein the portions of the first layer of nitride material left remaining after the first etch protect the portions of the layer of oxide material over the offset spacers during the second etch;

following the second etch, forming a second layer of nitride material over the gate stack, over the portions of the layer of oxide material left remaining over the offset spacers, and over the not covered portions of the substrate;

forming a layer of dielectric material over the second layer of nitride material; and forming conductive contacts in contact abutment with the portions of the layer of oxide material left remaining over the offset spacers, through the layer of dielectric material and down to source/drain regions formed in the substrate;

wherein forming the conductive contacts comprises forming via openings through the layer of dielectric material;

wherein forming the via openings removes portions of the second layer of nitride material over the portions of the layer of oxide material left remaining over the offset spacers; and wherein the first etch uses a first etchant; wherein the layer of oxide material is formed to a first thickness; wherein the first layer of nitride material is formed to a second thickness; and wherein the second thickness is related to the first thickness and to a selectivity of the first etchant, so that the second etch concurrently etches away substantially all of the portions of the first layer of nitride material left remaining after the first etch.

2. The method of claim 1, wherein the second thickness is related to the first thickness and to the selectivity of the first etchant, so that a ratio of the second thickness to the first thickness is about the same as a ratio of an etch rate of a second etchant used to etch the layer of oxide material to an etch rate of the first etchant used to etch the first layer of nitride material.

3. The method of claim 2, wherein the second etch forms sidewall spacers that consist substantially of oxide material over the offset spacers.

4. The method of claim 3, wherein the contacts are formed with an outward and upward taper.

5. The method of claim 4, wherein the source/drain extension regions are formed by the first implantation into first not covered portions of the substrate; and the source/drain regions are formed after forming the sidewall spacers, by performing a second implantation into second portions of the substrate not covered by the gate stack, the offset spacers, or the sidewall spacers.

6. The method of claim 5, further comprising conducting a second anneal to activate dopants implanted during the second implantation.

7. A method of manufacturing an integrated circuit, comprising:

forming a gate stack over a semiconductor substrate, the gate stack including a gate electrode formed over a gate dielectric;

forming offset spacers on sidewalls of the gate stack;

forming a layer of oxide material over the top of the gate stack, over the sidewalls of the gate stack, and over first portions of the substrate not covered by the gate stack;

forming a first layer of nitride material over the layer of oxide material including over the top of the gate stack, over the offset spacers, and over the first portions of the substrate;

etching the first layer of nitride material in a first etch to remove the first layer of nitride material from over the top of the gate stack and anisotropically from over the first portions of the substrate, leaving portions of the first layer of nitride material remaining over the offset spacers;

following the first etch, etching the layer of oxide material in a second etch to remove parts of the layer of oxide material from over the top of the gate stack and anisotropically from over the first portions of the substrate, leaving portions of the layer of oxide material as sidewall spacers remaining over the offset spacers, wherein the portions of the first layer of nitride material left remaining after the first etch protect the portions of the layer of oxide material over the offset spacers during the second etch;

after forming the sidewall spacers, forming source/drain regions in an implantation into second portions of the substrate not covered by the gate stack or the sidewall spacers;

following the second etch, forming a second layer of nitride material over the gate stack, over the portions of the layer of oxide material left remaining over the offset spacers, and over the not covered portions of the substrate;

forming a layer of dielectric material over the second layer of nitride material; and forming via openings through the layer of dielectric material down to the source/drain regions formed in the substrate; wherein forming the via openings removes portions of the second layer of nitride material over the portions of the layer of oxide material left remaining over the offset spacers; and filling the via openings with conductive material to form conductive contacts in contact abutment with the portions of the layer of oxide material left remaining over the offset spacers, through the layer of dielectric material and down to source/drain regions formed in the substrate;

wherein the first etch uses a first etchant; wherein the layer of oxide material is formed to a first thickness; wherein the first layer of nitride material is formed to a second thickness; and wherein the second thickness is related to the first thickness and to a selectivity of the first etchant, so that the second etch concurrently etches away substantially all of the portions of the first layer of nitride material left remaining after the first etch.

8. The method of claim 7, wherein the second thickness is related to the first thickness and to the selectivity of the first etchant, so that a ratio of the second thickness to the first thickness is about the same as a ratio of an etch rate of a second etchant used to etch the layer of oxide material to an etch rate of the first etchant used to etch the first layer of nitride material.

9. The method of claim 8, wherein the sidewall spacers consist substantially of oxide material.

10. The method of claim 9, wherein the contacts are formed with an outward and upward taper.

* * * * *